United States Patent [19]

Binder et al.

[11] Patent Number: 5,563,022

[45] Date of Patent: * Oct. 8, 1996

[54] POSITIVE-WORKING RADIATION-SENSITIVE MIXTURE AND THE PRODUCTION OF RELIEF PATTERNS

[75] Inventors: Horst Binder, Lampertheim; Reinhold Schwalm, Wachenheim; Dirk Funhoff, Heidelberg, all of Germany

[73] Assignee: BASF Aktiengesellschaft, Ludwigshafen, Germany

[ * ] Notice: The portion of the term of this patent subsequent to Oct. 29, 2010, has been disclaimed.

[21] Appl. No.: 968,408

[22] Filed: Oct. 29, 1992

[30] Foreign Application Priority Data

Nov. 2, 1991 [DE] Germany .................. 41 36 213.6

[51] Int. Cl.$^6$ .................. G03C 1/492; G03F 7/30; G03F 7/38
[52] U.S. Cl. .................. 430/270.14; 430/326; 430/330; 430/905; 430/910; 430/921; 522/59
[58] Field of Search .................. 430/270, 326, 430/921, 909, 910, 905, 330; 522/59

[56] References Cited

U.S. PATENT DOCUMENTS

| | | | |
|---|---|---|---|
| 3,915,706 | 10/1975 | Limburg et al. | |
| 3,923,514 | 12/1975 | Marsh. | |
| 4,678,737 | 7/1987 | Schneller et al. | 430/270 |
| 4,883,740 | 11/1989 | Schwalm et al. | 430/270 |
| 4,996,136 | 2/1991 | Houlihan et al. | 430/270 |
| 5,071,730 | 12/1991 | Allen et al. | 430/270 |
| 5,118,582 | 6/1992 | Ueno et al. | 430/270 |
| 5,202,217 | 4/1993 | Todoko et al. | 430/270 |
| 5,318,876 | 6/1994 | Schwalm et al. | 430/270 |
| 5,332,650 | 7/1994 | Murata et al. | 430/270 |
| 5,344,742 | 9/1994 | Sinta et al. | 430/270 |

FOREIGN PATENT DOCUMENTS

| | | | |
|---|---|---|---|
| 2066148 | 10/1992 | Canada | 430/270 |
| 0330406 | 8/1989 | European Pat. Off. . | |
| 0330386 | 8/1989 | European Pat. Off. . | |
| 0388813 | 9/1990 | European Pat. Off. . | |
| 0440376 | 8/1991 | European Pat. Off. | 430/325 |
| 3-223865 | 10/1991 | Japan | 430/270 |
| 3-223864 | 10/1991 | Japan | 430/270 |
| 3-223862 | 10/1991 | Japan | 430/270 |

OTHER PUBLICATIONS

Cas Registry Search Jan. 6, 1994.
Reichmanis et al., *Micro. Eng.*, vol. 14, pp. 215–226, Sep., 1991.
Schlegel et al., *Micro. Eng.*, vol. 14, pp. 227–236, Sep., 1991.
Reichmanis et al., *Chem. Mater.*, Mar. 1991, pp. 394–407.
Yamaoka et al., *J. of Photopolymer Science and Tech.*, vol. 3, No. 3, 1990, pp. 275–280.
*SPIE*, vol. 1466, 1991, MacDonald et al., pp. 2–12.
*SPIE*, vol. 1466, 1991, Nalamasu et al., pp. 13–25.
Abstract of Japanese Patent 58–114030–A (Jul. 7, 1983).

*Primary Examiner*—Janis L. Dote
*Attorney, Agent, or Firm*—Keil & Weinkauf

[57] ABSTRACT

A positive-working UV-sensitive mixture containing (a1) an organic binder containing acid-labile ether, ester or carbonate groups or (a2) a polymeric binder which is insoluble in water but soluble in aqueous alkaline solutions and (a2.1) an organic compound whose solubility in an aqueous alkaline developer is increased by the action of an acid, or (a2.2) an organic compound whose solubility in an aqueous alkaline developer is increased by the action of an acid and which contains one or more acid-cleavable groups and in addition a group which forms an acid under the action of radiation, or a mixture of the organic compounds (a2.1) and (a2.2) and (b) an arylsulfonic ester, is suitable for the production of relief patterns.

9 Claims, No Drawings

POSITIVE-WORKING RADIATION-SENSITIVE MIXTURE AND THE PRODUCTION OF RELIEF PATTERNS

The present invention relates to positive-working radiation-sensitive mixtures which contain acid-labile groups and photoactive components, are sensitive to UV radiation and have an improved processing latitude. These radiation-sensitive mixtures are particularly suitable as resist materials for one-layer resists for the production of relief patterns.

Positive-working radiation-sensitive mixtures are known. Positive-working resist materials which contain o-quinonediazides in aqueous alkaline binders, e.g. novolaks, are used commercially as photoresists, so that the processes for the production of relief images are also known.

In addition to the o-quinonediazides, which give an alkali-soluble carboxylic acid for solubility differentiation via the Wolff rearrangement reaction on exposure to light, alkali-insoluble carboxylic esters (benzoic esters, phthalic esters) and sulfonic esters (benzenesulfonic esters, p-toluenesulfonic esters and naphthalenesulfonic esters) are also described, the latter, however, requiring the effect of high energy radiation (electron beams, X-rays and γ-radiation) in order to form a carboxylic or sulfonic acid which gives rise to the solubility differentiation between exposed and unexposed parts (cf. for example J 58114 030 A). However, the sensitivity of these systems to radiation is unsatisfactory in some cases.

Sulfonic esters as acid-forming components in UV-sensitive mixtures are not yet known.

Radiation-sensitive systems which produce, in the primary photoreaction, a species which then initiates a catalytic secondary reaction independently of the radiation and thus dramatically increases the sensitivities have also been developed. Such systems which photochemically produce a strong acid and then cleave acid-labile groups in a secondary reaction are disclosed in, for example, U.S. Pat. Nos. 3,923,514 and 3,915,706 and DE-A 34 06 927.

Examples of known compounds of this type which produce an acid photochemically are onium salts, halogen compounds, nitrobenzyl sulfonates, activated sulfonic esters, such as benzoin tosylates (EP-A-330 406), phenyl alkylsulfonates (EP-A-388 813), sulfones and disulfones, p-nitrobenzyl dimethoxyanthracene-2-sulfonate, iminosulfonates and naphthoquinone-4-sulfonates. E. Reichmanis et al. in Chem. Mater. 3 (1991), 394–407 give a good overview of photochemical acid donors.

A publication on the p-nitrobenzyl dimethoxyanthracenesulfonates (Journal of Photopolymer Science and Technology 3 (1990), 275–280) states that the aromatic p-nitrobenzyl sulfonates having a relatively high degree of condensation, for example of anthracene, pyrene, etc., dissociate on exposure to the corresponding sulfonic acids, but the p-nitrobenzyl toluenesulfonates and benzenesulfonates do not do so. If the ethyl esters are used instead of the p-nitrobenzyl esters, even the esters of aromatics having a relatively high degree of condensation do not dissociate to give the corresponding sulfonic acids on exposure to the light of wavelengths 436 nm, 365 nm and 254 nm.

o-Nitrobenzyl sulfonates as acid donors are described in, for example, EP-A-330 386. These compounds undergo a photoinduced reaction corresponding to the known o-nitrobenzyl rearrangement to give sulfonic acids.

However, resist systems based on tert-butoxycarbonyl groups as acid-labile units and, for example, either onium salts or o-nitrobenzyl esters as photochemical acid donors have the disadvantage that they are very sensitive to very small amounts of basic impurities in the ambient air and thus have a very limited processing latitude, as described at the SPIE Conference 4/5 Mar. 1991, Symposium on Microlithography, San Jose, Calif., USA, Publication [1466-01] Airborne chemical contamination of a chemically amplified resist and [1466-02] Preliminary lithographic characteristics of an all-organic chemically amplified resist formulation for single layer deep-UV lithography. Both publications indicate that the processing latitude is limited; in the latter, storage for up to 15 minutes after exposure results in resist profiles which are no longer usable.

Furthermore, DE-A 3 721 741 proposes radiation-sensitive mixtures which contain a polymeric binder soluble in aqueous alkaline solutions and an organic compound whose solubility in an aqueous alkaline developer is increased by the action of an acid and which contains one or more acid-cleavable groups, this organic compound producing a strong acid under the action of radiation. These mixtures too exhibit a limited processing latitude, particularly when the ambient air contains impurities, for example bases.

The disadvantage of many of these systems is therefore their sensitivity to storage times, in particular between the processing step of exposure and the subsequent process involving the secondary reaction for the elimination of the acid-labile groups, which is generally assisted by heating. Storage times between the process steps of exposure and heating after exposure generally lead to longer development times or to residual layers which cannot be developed. There is therefore a need for UV photoresist systems having high photo-sensitivity, good resistance to etching, freedom from metal ions and adequate processing latitude.

It is an object of the present invention to provide UV-sensitive mixtures by means of which purely organic one-layer photoresists can be processed on the basis of acid-catalyzed reactions, in particular in short-wavelength UV-sensitive positive-working coating materials containing acid-labile organic groups and organic photochemical acid donors, to give relief images, a processing latitude suitable in practice being made possible, in particular with respect to storage times between exposure and heating steps.

We have found that, surprisingly, this object is very advantageously achieved by the novel mixtures.

The present invention relates to positive-working UV-sensitive mixtures containing (a1) a water-insoluble organic binder which contains acid-labile ether, ester or carbonate groups and is soluble in aqueous alkaline solutions as a result of the action of an acid, or (a2) a polymeric binder which is insoluble in water but soluble in aqueous alkaline solutions and (a2.1) an organic compound whose solubility in an aqueous alkaline developer is increased by the action of an acid, or (a2.2) an organic compound whose solubility in an aqueous alkaline developer is increased by the action of an acid and which contains one or more acid-cleavable groups and in addition a group which forms an acid under the action of radiation, or a mixture of the organic compounds (a2.1) and (a2.2) and (b) an organic compound which produces an acid under the action of UV radiation, wherein an arylsulfonic ester of the general formula (I)

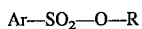
$$\mathrm{Ar{-}SO_2{-}O{-}R} \tag{I}$$

where Ar is phenyl or is nitrophenyl or phenyl which is monosubstituted, disubstituted or trisubstituted by $C_1$–$C_4$-alkyl, $C_1$–$C_4$-alkoxy or halogen and R is $C_1$–$C_{12}$-alkyl, cycloalkyl, aryl or aralkyl of not more than 12 carbon atoms or is alkyl, cycloalkyl, aryl or aralkyl of not more than 12 carbon atoms which is monosubstituted or polysubstituted by alkyl, alkoxy or halogen, or Ar together with R forms an unsubstituted or substituted five-membered or six-membered ring, is used as the organic compound (b).

Preferred acid-labile ether, ester or carbonate groups are tert-butyl ethers of phenols, tert-alkyl carbonates of phenols or tert-butyl esters of carboxylic acids.

Particularly preferred organic binders (a1) containing acid-labile carbonate groups are poly-p-tert-butoxycarbonyloxystyrene and a copolymer of p-tert-butoxycarbonyloxystyrene, and preferred organic binders (a1) containing acid-labile ester groups are poly-(tert-butyl methacrylate) and a copolymer of tert-butyl methacrylate.

Preferred examples of polymeric binders (a2) which are insoluble in water but soluble in aqueous alkaline solutions are poly-(p-hydroxystyrene), poly-(p-hydroxy-α-methylstyrene), copolymers of p-hydroxy-(α-methyl)-styrene with tert-butoxycarbonyloxystyrene, tert-amylcarbonyloxystyrene, tert-butoxystyrene, tert-butyl methacrylate, 2-methylhydroxystyrene and/or 2,6-dimethylhydroxystyrene, the amount of the comonomers being chosen so that the binders are soluble in an aqueous alkaline solvent of suitable pH.

The present invention furthermore relates to a process for the production of relief patterns by imagewise UV exposure of a radiation-sensitive recording layer to a dose such that the solubility of the exposed parts, if necessary after a thermal heating step at from 60° to 130° C., in aqueous alkaline solutions increases, and these parts can be removed selectively by means of the aqueous alkaline developer, wherein the radiation-sensitive recording layer essentially consists of a novel radiation-sensitive mixture.

The novel radiation-sensitive mixtures surprisingly permit the production of relief patterns and relief images having high resolution in conjunction with processibility in conformity with practical requirements and a sufficiently large processing latitude, in particular with tolerable storage times of >15 minutes between exposure and the heating step.

Furthermore, the sensitivity of the systems is very high owing to the catalytic effect of the photo-chemically produced acids, and very high contrast values are obtained. These radiation-sensitive mixtures are therefore very suitable for use in deep-UV lithography.

Regarding the components of the novel radiation-sensitive mixture, the following may be stated specifically.

(a1) Suitable water-insoluble organic binders (a1) which contain acid-labile ether, ester or carbonate groups and are soluble in aqueous alkaline solutions as a result of the action of an acid are polymers based on homo- or copolymers of p-tert-butoxystyrene, p-tert-butoxycarbonyloxystyrene or tert-amylcarbonyloxystyrene, and suitable comonomer units are all monomers which are copolymerizable with styrene, for example acrylates, methacrylates, styrene and derivatives thereof, sulfur dioxide and maleimides, but in particular p-hydroxystyrene and/or p-hydroxy-α-methylstyrene and hydroxystyrenes which are monosubstituted or disubstituted ortho to the OH group; poly-(p-tert-butoxycarbonyloxy)-styrene and poly-(p-tert-butoxystyrene) are preferred.

The polymeric binder (a1) is present in the novel mixture in general in an amount of from 55 to 99, preferably from 70 to 97, % by weight, based on the sum of components (a1) and (b).

(a2) Suitable polymeric binders (a2) which are insoluble in water but soluble in aqueous alkaline solutions are polymers based on homo- or copolymers of p-hydroxystyrene and/or p-hydroxy-α-methylstyrene, suitable comonomer units being in particular hydroxystyrenes which are monosubstituted or disubstituted ortho to the hydroxyl group or hydroxystyrenes whose phenolic group is protected by acid-labile groups. Particularly preferred acid-labile groups are tert-alkyl carbonates, such as tert-butyl carbonates, tert-amyl carbonates, ethers and acetals, such as tert-butyl ethers and tert-butyl esters. The comonomer units are present only in amounts such that the polymer is soluble in aqueous alkaline media, preferably in the range from 10 to 70 mol %.

The polymers (a1) and (a2) generally have average molecular weights $\bar{M}w$ of from 2,000 to 100,000, preferably from 8,000 to 30,000.

Examples of organic compounds (a2.1) which contain acid-labile groups, preferably tert-alkyl ethers, tert-alkyl esters, acetals or tert-alkyl carbonates, are:

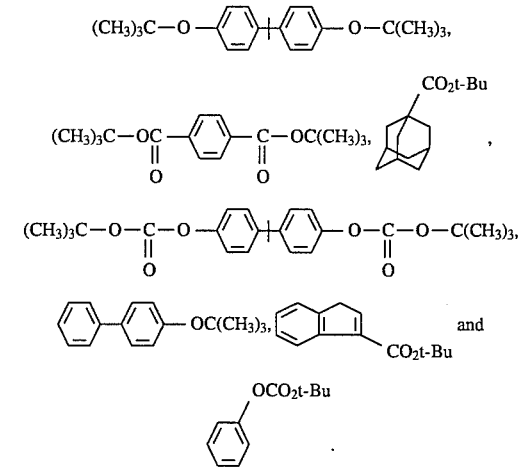

Particularly suitable organic compounds (a2.2) whose solubility in an aqueous alkaline developer is increased by the action of an acid and which contain one or more acid-cleavable groups and in addition a group which forms a strong acid under the action of radiation are onium salts containing acid-labile groups, as described in U.S. Pat. No. 4,883,740.

Particularly preferred organic compounds (a2.2) are those of the general formula (II)

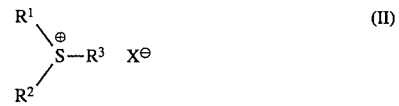

where $R^1$, $R^2$ and $R^3$ are identical or different and are aliphatic and/or aromatic radicals which may contain hetero atoms, or two of the radicals $R^1$ to $R^3$ are bonded to one another to form a ring, with the proviso that one or more of the radicals $R^1$ to $R^3$ contains one or more acid-cleavable groups, preferably tert-butyl carbonates of phenols or tert-alkyl ethers of phenols, and one of the radicals $R^1$ to $R^3$ may be bonded to one or more further sulfonium salt radicals, if required via acid-cleavable groups, and $X^{TM}$ is a nonnucleophilic counter-ion.

Preferred counter-ions are strong organic acid anions, such as tosylate, mesylate, benzenesulfonate, trifluoromethanesulfonate and fluorosulfonate.

b) Suitable organic compounds (b) according to the invention are arylsulfonic esters of the general formula (I)

where Ar is phenyl which is unsubstituted or monosubstituted, disubstituted or trisubstituted by $C_1$–$C_4$-alkyl, for example tolyl or xylyl, phenyl which is monosubstituted, disubstituted or trisubstituted by $C_1$–$C_4$-alkoxy, for example methoxyphenyl, ethoxyphenyl, propoxyphenyl or butoxyphenyl, halogen-substituted phenyl, e.g. chlorophenyl or bromophenyl, or nitrophenyl, and R is $C_1$–$C_{12}$-alkyl, preferably $C_1$–$C_6$-alkyl, for example methyl, ethyl, n-propyl, isopropyl, n-butyl, isobutyl, tert-butyl, amyl, hexyl, octyl, 2-ethylhexyl, decyl or dodecyl, cycloalkyl, e.g. cyclohexyl or cyclopentyl, aryl, e.g. phenyl, aralkyl of not more than 12 carbon atoms, e.g. benzyl, alkyl, cycloalkyl, aryl or aralkyl of not more than 12 carbon atoms which is monosubstituted or polysubstituted by alkyl, alkoxy or halogen (e.g. fluorine, chlorine or bromine), or Ar together with R forms a five-membered or six-membered ring which is unsubstituted or substituted by halogen, such as fluorine, chlorine or bromine, or by alkyl of 1 or 2 carbon atoms or alkoxy of 1 or 2 carbon atoms, for example

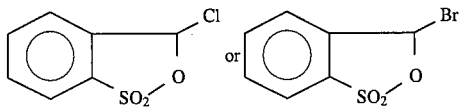

Examples of preferred compounds (b) are

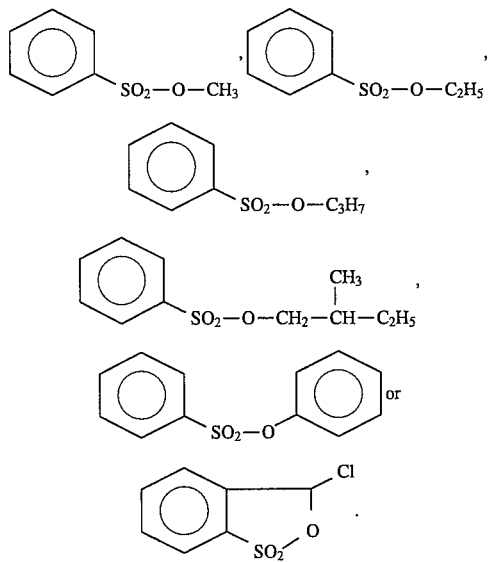

The compounds (b) are present in the novel mixture in general in an amount of from 0.5 to 20, preferably from 1 to 15, % by weight, based on the total amount of the radiation-sensitive mixture.

The organic compounds (b) of the formula (I) can in principle all be prepared by processes as already described in the literature, for example in Organikum, VEB-Verlag Berlin 1976, 15th Edition, page 684.

For the case of novel mixtures of components (a2), (a2.1) and (b), compound (a2) is preferably present in amounts of 90–40% by weight, component (a2.1) in amounts of 9–40% by weight and component (b) in amounts of 1–20% by weight, based on the total amount of components (a2)+(a2.1)+(b).

For the case of mixtures of components (a2), (a2.1) and/or (a2.2) and (b), these are preferably present in amounts of from 97 to 60% by weight (a2), from 1 to 20% by weight (a2.1), from 1 to 20% by weight (a2.2) and from 1 to 20% by weight (b), based on the total amount of these components, with the proviso that the sum of the percentages is equal to 100 in each case, and components (a2.1) and (a2.2) may replace one another.

For the production of resists and relief patterns, the novel mixtures are preferably dissolved in an organic solvent, the solids content usually being from 5 to 40% by weight. Preferred solvents are aliphatic ketones, ethers and esters and mixtures thereof. Alkylene glycol monoalkyl ethers, for example ethylcellosolve, butylglycol, methylcellosolve and 1-methoxy- 2-propanol, alkylene glycol alkyl ether esters, for example methylcellosolve acetate, methyl propylene glycol acetate and ethyl propylene glycol acetate, ketones, for example cyclohexanone, cyclopentanone and methyl ethyl ketone, acetates, such as butyl acetate, aromatics, such as toluene and xylene, and ethyl acetate and diacetone alcohol are particularly preferred. The choice of the corresponding solvents and mixtures thereof depends on the choice of the particular polymer and of the photoactive component.

Other additives, such as adhesion promoters, wetting agents, dyes and plasticizers, may also be added to the novel mixture.

If necessary, small amounts of sensitizers may also be added in order to sensitize the compounds in the longer wavelength UV to visible range. Polycyclic aromatics, such as pyrene and perylene, are preferred for this purpose, but other dyes which act as sensitizers may also be used.

In the novel process for the production of relief patterns, a radiation-sensitive recording layer which essentially consists of the novel radiation-sensitive mixture is exposed imagewise in a conventional manner to a dose such that the solubility of the exposed parts, if necessary after a thermal heating step at from 60° to 130° C., in aqueous alkaline solvents increases, and these parts can be selectively removed by means of the alkaline developer.

For example, the polymeric binder having acid-labile groups and 1–10, in particular 2–5, % by weight, based on the solids content of the radiation-sensitive mixture, of a novel arylsulfonic ester (b) are preferably dissolved in methoxypropyl acetate, the solids content being from 10 to 30% by weight. The solution can be filtered through a filter having a pore size of 0.2 μm. By application of the resist solution by spin coating at speeds of from 1,000 to 10,000 rpm, a resist film having a layer thickness of from 2 to 0.5 μm is produced on a surface-oxidized silicon wafer. The wafer is then dried by heating it for from 1 to 5 minutes at from 60° to 120° C. The films are then exposed imagewise, for example through a chromium-plated structured quartz mask to UV light from a high pressure mercury lamp or to excimer laser light. The exposed films are developed with aqueous alkaline or alcohol-containing aqueous alkaline developers and, if necessary, heated beforehand for from 5 seconds to 5 minutes at from 60° to 130° C.

The novel process is distinguished in particular by the fact that storage times in normal ambient air of more than 15 minutes can be tolerated between the process steps of exposure and heating after exposure without any loss of efficiency, ie. sensitivity and structural quality.

In the Examples which follow, parts and percentages are by weight, unless stated otherwise.

EXAMPLE 1

A photoresist solution is prepared from 10 parts of ethyl 4-toluenesulfonate, 90 parts of poly-(p-vinyl-phenol-co-p-tert-butoxycarbonyloxystyrene) (molar ratio of the comonomers 8:2) and 300 parts of methoxypropyl acetate. This solution is then filtered through a filter having a pore diameter of 0.2 μm.

This solution is applied by spin coating to give a layer about 1 μm thick on a surface-oxidized silicon wafer and is heated for 1 minute at 90° C. After exposure through a structured test mask to excimer laser light of wavelength 248 nm, this wafer is heated at different temperatures (hotplate time/hotplate temperature) and is structured using an alkaline developer.

The $\Gamma_p$ value was determined from the contrast curves. For positive resist systems, the gamma value is defined as $\Gamma_p = [\log D_1/D_0]^{-1}$, where $D_0$ and $D_1$ are the extra-polated exposure energy doses from the characteristic curve.

| Hotplate time [min] | Hotplate temperature [°C.] | Exposure (Photospeed) mJ/cm² | Contrast $\Gamma_p$ |
| --- | --- | --- | --- |
| 1 min | 90 | Structuring not possible | |
| 1 min | 100 | 140 | 2.7 |
| 1 min | 110 | 60 | 5.6 |
| 1 min | 120 | 40 | 8.0 |
| 1 min | 130 | 29 | 32 |

EXAMPLE 2

A plurality of wafers are coated with the resist solution according to Example 1 and are heated and exposed. After a storage time of 1, 2 and 4 hours, the thermal aftertreatment is carried out (1 minute at 120° C.). All wafers can be satisfactorily developed to give a positive relief pattern. No differences are detectable between the wafers stored for different times.

COMPARATIVE EXAMPLE 1

If tris-(4-tert-butoxycarbonyloxyphenyl)-sulfonium trifluromethanesulfonate is used instead of ethyl 4-toluenesulfonate, the wafers can no longer be structured after a storage time of only one hour.

EXAMPLE 3

A photoresist solution is prepared similarly to Example 1, but the sulfonate used is (−)-di-O-tosyl- 2,3,0-isopropylidene-L-1,2,3,4,-butanetetraol (Fluka).

This resist solution is applied by spin coating to an oxidized silicon wafer, and the polymer film is heated on the hotplate for 1 minute at 90° C.

After exposure through a structured test mask, a wafer is immediately heated (1 minute at 120° C.) and developed and a control wafer is heated and developed only after a waiting time of 2 hours.

The development time for different exposure energies of the two wafers was measured. There are virtually no detectable differences:

| Exposure energy | Development time (sec) | |
| --- | --- | --- |
| mJ/cm² | Wafer 1 | Control wafer |
| 56 | 21 | 20 |
| 66 | 20 | 20 |
| 76 | 21 | 22 |

COMPARATIVE EXAMPLE 2

A resist formulation is prepared from 6 parts of tris-(4-tert-butoxycarbonyloxyphenyl)-sulfonium trifluoromethanesulfonate, 94 parts of poly-(p-vinylphenol) and 300 parts of methyl propylene glycol acetate.

This solution is processed similarly to Example 3. After a storage time of 2 hours between exposure and heating, the resist pattern is no longer developable.

EXAMPLE 4

A photoresist solution consisting of 10 parts of 2-methylbutyl p-toluenesulfonate, 90 parts of poly-(p-vinylphenol-co-p-tert-butoxycarbonyloxystyrene) (molar ratio of the comonomers 8:2) and 300 parts of methoxypropyl acetate is applied by spin coating according to Example 1 to oxidized silicon wafers and is heated for 1 minute at 90° C.

After exposure to excimer laser light of wavelength 248 nm, the heating process and the structuring with an alkaline developer, the following residual layer thicknesses were measured using the profilometer:

| Exposure energy [mJ/cm²] | Residual layer [%] |
| --- | --- |
| 50 | 1.001 |
| 113 | 1.001 |
| 133 | 0.966 |
| 152 | 0.392 |
| 187 | 0.276 |
| 225 | 0 |

EXAMPLE 5

A photoresist solution consisting of 10 parts of methyl p-toluenesulfonate, 90 parts of poly-(p-vinyl-phenol-co-tert-butoxycarbonyloxystyrene) (molar ratio of the comonomers 8:2) and 300 parts of methoxypropyl acetate is treated similarly to Example 4, applied to surface-oxidized Si wafers and dried. After structuring with an alkaline developer, the following residual layer thicknesses were measured:

| Exposure energy [mJ/cm²] | Residual layer [%] |
| --- | --- |
| 36 | 0.997 |
| 44 | 0.928 |
| 50 | 0.787 |
| 58 | 0.476 |
| 66 | 0.209 |
| 84 | 0 |
| 94 | 0 |

EXAMPLE 6

A photoresist solution is prepared from 5 parts of 3-chloro-1,2-benzoxathiol 1,1-dioxide, 95 parts of poly-(p-vinylphenol-co-p-tert-butoxycarbonyloxystyrene) (molar ratio of the comonomers 8:2) and 300 parts of methoxypropyl acetate and is treated similarly to Example 4, applied by spin coating to surface-oxidized Si wafers and dried. After development with an alkaline medium, the following residual layer thicknesses are determined:

| Exposure energy [mJ/cm²] | Residual layer [%] |
| --- | --- |
| 18.20 | 1.0 |
| 25.2 | 1.00 |
| 33.25 | 0.99 |
| 41.8 | 0.98 |
| 76.3 | 0.89 |
| 94.0 | 0.0 |
| 113.0 | 0.0 |

Wafers which are stored after exposure can be readily developed even after one hour.

EXAMPLE 7

10 parts of (+)-1,4-di-O-tosyl-2,3,0-isopropylidene-D-1,2,3,4-butanetetraol and 90 parts of poly-(p-vinylphenol-co-p-tert-butoxycarbonyloxystyrene) (molar ratio of the comonomers 8:2) are dissolved in 300 parts of methoxypropyl acetate. The further procedure is similar to that of Example 4.

Structures smaller than 1 μm can be produced with about 36 mJ/cm². The wafers can be readily developed even after storage for 1 hour.

EXAMPLE 8

10 parts of phenyl p-toluenesulfonate and 90 parts of poly-(p-vinylphenol-co-p-tert-butoxycarbonyloxystyrene) (molar ratio of the comonomers 8:2) are dissolved in 300 parts of methoxypropyl acetate. After filtration of this solution, a polymer layer about 1 μm thick is applied by spin coating to oxidized silicon wafers and is heated for 1 minute at 90° C. on a hotplate.

After exposure through a structured test mask to excimer laser light of wavelength 248 nm, the wafers are heated at various temperatures to determine the most advantageous process parameters and are then immediately developed. Good structures are obtained at from 110° to 120° C. after only 1 minute. If the wafers are heated at below 100° C., longer times are required for structuring.

Structured wafers which were stored for several hours in the exposed state and then stored for 1 minute at 120° C. could be readily developed.

We claim:

1. A positive-working UV-sensitive mixture containing (a1) a water-insoluble organic binder which contains acid-labile ether, ester or carbonate groups and is soluble in aqueous alkaline solutions as a result of the action of an acid, or (a2) a polymeric binder which is insoluble in water but soluble in aqueous alkaline solutions and (a2.1) an organic compound whose solubility in an aqueous alkaline developer is increased by the action of an acid, or (a2.2) an organic compound whose solubility in an aqueous alkaline developer is increased by the action of an acid and which contains one or more acid-cleavable groups and in addition a group which forms an acid under the action of radiation, or a mixture of the organic compounds (a2.1) and (a2.2) and (b) an organic compound which produces an acid under the action of UV radiation, wherein said organic compound is an arylsulfonic ester of the formula (I)

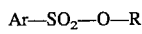

where Ar is phenyl or phenyl which is monosubstituted, disubstituted or trisubstituted by $C_1$–$C_4$-alkyl, $C_1$–$C_4$-alkoxy or halogen and R is $C_1$–$C_{12}$-alkyl, cycloalkyl selected from the group consisting of cyclopentyl and cyclohexyl or aryl, or Ar together with R forms a five-membered or six-membered ring which is unsubstituted or substituted by halogen, alkyl of 1 or 2 carbon atoms or alkoxy of 1 or 2 carbon atoms.

2. A radiation-sensitive mixture as claimed in claim 1, wherein tert-butyl ethers of phenols, tert-alkyl carbonates of phenols or tert-butyl esters of carboxylic acids are used as acid-labile ether, ester or carbonate groups.

3. A radiation-sensitive mixture as claimed in claim 1, wherein poly-p-tert-butoxycarbonyloxystyrene or a copolymer of p-tert-butoxycarbonyloxystyrene is used as the organic binder containing acid-labile carbonate groups.

4. A radiation-sensitive mixture as claimed in claim 1, wherein poly-(tert-butyl methacrylate) or a copolymer of tert-butyl methacrylate is used as the organic binder containing acid-labile ester groups.

5. A radiation-sensitive mixture as claimed in claim 1, wherein

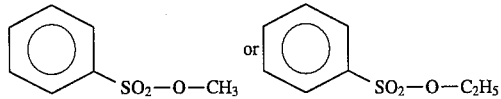

is used as the organic compound (b).

6. A radiation-sensitive mixture as claimed in claim 1, wherein

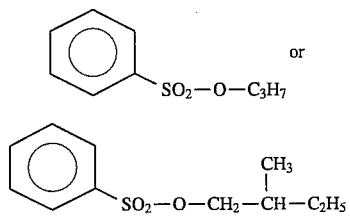

is used as the organic compound (b).

7. A radiation-sensitive mixture as claimed in claim 1, wherein

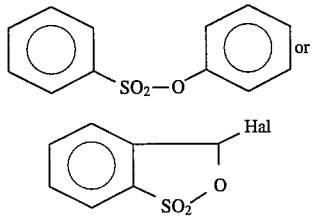

where Hal is chlorine or bromine, is used as the organic compound (b).

8. A process for the production of a relief pattern, wherein a radiation-sensitive recording layer is exposed imagewise to UV light in a dose such that the solubility of the exposed parts, after a thermal heating step at from 60° to 130° C., in aqueous alkaline solutions increases, and these parts are removed selectively by means of an aqueous alkaline developer, wherein the radiation-sensitive recording layer consists essentially of the UV sensitive mixture as claimed in claim 1.

9. A radiation-sensitive mixture as claimed in claim 1, wherein the polymeric binder (a2) which is insoluble in water but soluble in aqueous alkaline solutions is poly-(p-hydroxystyrene), poly-(p-hydroxy-α-methylsytrene) or a copolymer of p-hydroxystyrene or p-hydroxy-α-methyl styrene with at least one compound selected from the group consisting of tert-butoxycarbonyloxystyrene, tert-amylcarbonyloxystyrene, tert-butoxystyrene, tert-butyl methacrylate, 2-methylhydroxystyrene and 2,6-dimethylhydroxystyrene.

* * * * *

UNITED STATES PATENT AND TRADEMARK OFFICE
CERTIFICATE OF CORRECTION

PATENT NO.: 5,563,022

DATED: October 8, 1996

INVENTOR(S): BINDER et al.

It is certified that error appears in the above-identified patent and that said Letters Patent is hereby corrected as shown below:

On the cover page, item [*] Notice, the date "Oct. 29, 2010" should be --Apr. 3, 2012--.

Signed and Sealed this

Twenty-fourth Day of December, 1996

Attest:

BRUCE LEHMAN

*Attesting Officer*    *Commissioner of Patents and Trademarks*